United States Patent
Willis et al.

(10) Patent No.: US 11,569,817 B2
(45) Date of Patent: Jan. 31, 2023

(54) METHOD TO CONTROL AMPLITUDE AND PHASE OF A SIGNAL

(71) Applicant: Alps Alpine Co., Ltd., Ota-ku (JP)

(72) Inventors: David Willis, Murray, UT (US); Brent Quist, Cedar Rapids, IA (US)

(73) Assignee: Alps Alpine Co., Ltd.

( * ) Notice: Subject to any disclaimer, the term of this patent is extended or adjusted under 35 U.S.C. 154(b) by 295 days.

(21) Appl. No.: 17/071,437

(22) Filed: Oct. 15, 2020

(65) Prior Publication Data
US 2022/0123748 A1  Apr. 21, 2022

(51) Int. Cl.
*H03K 17/955* (2006.01)
*G01D 5/24* (2006.01)
*G06F 3/044* (2006.01)

(52) U.S. Cl.
CPC .......... *H03K 17/955* (2013.01); *G01D 5/24* (2013.01); *G06F 3/044* (2013.01)

(58) Field of Classification Search
CPC ....... H03K 17/955; H03K 2217/96072; H03K 2217/96073; G01D 5/24; G06F 3/044; G06F 3/0416
See application file for complete search history.

(56) References Cited

U.S. PATENT DOCUMENTS

| | | |
|---|---|---|
| 6,304,199 B1 | 10/2001 | Fang et al. |
| 8,154,310 B1 | 4/2012 | Maharyta et al. |
| 8,842,855 B2 | 9/2014 | Adachi |
| 9,553,603 B2 | 1/2017 | Kikuta |
| 10,171,046 B2 | 1/2019 | Kropfitsch et al. |
| 10,291,246 B2 | 5/2019 | Chandra et al. |
| 10,305,490 B2 | 5/2019 | Fukuzawa et al. |
| 10,333,542 B2 | 6/2019 | Chang |
| 2012/0177227 A1 | 7/2012 | Adachi |
| 2013/0015866 A1* | 1/2013 | Wendt ............ B60N 2/002 324/679 |
| 2014/0145997 A1 | 5/2014 | Tiruvuru |
| 2015/0035787 A1 | 2/2015 | Shahparnia et al. |

(Continued)

OTHER PUBLICATIONS

International Search Report for corresponding International Application No. PCT/US21/48857 dated Dec. 2, 2021 (2 Pages).

(Continued)

*Primary Examiner* — Amy He
(74) *Attorney, Agent, or Firm* — Harness, Dickey & Pierce, P.L.C.

(57) ABSTRACT

A system for generating an offset signal for a capacitive sensor includes a waveform generator configured to generate a waveform, an R-2R ladder circuit having a constant output resistance that is coupled to an output of the waveform generator and is configured to generate the offset signal based on the waveform, and an adjustable capacitor that is connected between an output of the R-2R ladder circuit and a reference voltage. The capacitive sensor includes one or more sensing electrodes coupled to the waveform generator through a capacitance and is configured to generate a sensed signal by sensing an object. The R-2R ladder circuit and the adjustable capacitor are configured to adjust amplitude and phase of the offset signal such that the amplitude and the phase of the offset signal respectively coincide with an amplitude and a phase of the sensed signal when the sensing electrodes do not sense the object.

15 Claims, 3 Drawing Sheets

(56) References Cited

U.S. PATENT DOCUMENTS

2016/0294407 A1* 10/2016 Kikuta .................. H03M 1/785
2021/0055824 A1* 2/2021 Shen ....................... G06F 3/044

OTHER PUBLICATIONS

Written Opinion for corresponding International Application No. PCT/US21/48857 dated Dec. 2, 2021 (5 Pages).
Wolke, by:Alan. "Tutorial: Digital to Analog Conversion," The R-2R DAC. The R2R DAC Ladder Digital to Analog Tutorial, Tektronix, Jun. 23, 2015, www.tek.com/blog/tutorial-digital-analog-conversion-r-2r-dac, 8 pages.
Kester, Walt. "Basic DAC Architectures II: Binary DACs," MT-015 Tutorial, Analog Devices, 2009, www.analog.com/media/en/training-seminars/tutorials/MT-015.pdf. Accessed Oct. 15, 2020, 10 pages.

\* cited by examiner

METHOD TO CONTROL AMPLITUDE AND PHASE OF A SIGNAL

FIELD

The present disclosure relates to capacitive sensors, and more particularly to controlling an amplitude and a phase of an offset signal of a capacitive sensor.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An electronic device may implement a capacitive sensor configured to sense contact between an object (e.g., a finger) and a surface, such as a surface of the electronic device, and generate a signal indicative of the sensed contact. For example, a waveform generator is configured to generate and output a signal to the capacitive sensor. In some examples, the signal is sinusoidal (i.e., the signal is a sine wave). An amplitude and/or phase of the sine wave changes based on whether an object is contacting the sensor. Accordingly, the presence or absence of an object contacting the sensor can be determined based on changes in the amplitude or phase of the sine wave.

SUMMARY

A system for generating an offset signal for a capacitive sensor includes a waveform generator configured to generate a waveform, an R-2R ladder circuit having a constant output resistance that is coupled to an output of the waveform generator and is configured to generate the offset signal based on the waveform, and an adjustable capacitor that is connected between an output of the R-2R ladder circuit and a reference voltage. The capacitive sensor includes one or more sensing electrodes coupled to the waveform generator through a capacitance and is configured to generate a sensed signal by sensing either of proximity of an object and contact with the object. The R-2R ladder circuit and the adjustable capacitor are configured to adjust amplitude and phase of the offset signal such that the amplitude and the phase of the offset signal respectively coincide with an amplitude and a phase of the sensed signal when the sensing electrodes do not sense either of proximity of the object and contact with the object.

In other features, the system further includes an output circuit including a differential amplifier having a first input terminal coupled to an output of the capacitive sensor and a second input terminal coupled to the output of the R-2R ladder circuit. The output circuit is configured as a multiple feedback filter, and wherein the differential amplifier is a fully differential amplifier. The waveform is a sinewave. The system further includes a control signal module configured to generate a control signal based on the waveform. The R-2R ladder circuit is configured to operate in a voltage mode. The R-2R ladder circuit includes a plurality of rungs each including at least one resistor and a switch configured to selectively connect the at least one resistor to the waveform.

In other features, operating the switches of the plurality of rungs adjusts the amplitude of the offset signal. The R-2R ladder circuit includes a first limit resistor connected between an input of the R-2R ladder circuit and the output of the R-2R ladder circuit and a second limit resistor connected between a common voltage and the output of the R-2R ladder circuit. Values of the first limit resistor and the second limit resistor are selected to set an adjustable range of the amplitude of the offset signal. The system further includes a low pass filter including a resistor and a second adjustable capacitor. The low pass filter is located on a pre-stage of the output circuit and adjusting the second adjustable capacitor adjusts the phase of the sensed signal.

A method for generating an offset signal for a capacitive sensor includes generating a waveform, receiving the waveform at an R-2R ladder circuit having a constant output resistance, and, using the R-2R ladder circuit, generating the offset signal based on the waveform, connecting an adjustable capacitor between an output of the R-2R ladder circuit and a reference voltage, receiving the waveform at one or more sensing electrodes of the capacitive sensor, sensing, using one or more sensing electrodes, either of proximity of and contact with an object to generate a sensed signal, and, using the R-2R ladder circuit and the adjustable capacitor, adjusting amplitude and phase of the offset signal such that the amplitude and the phase of the offset signal respectively coincide with an amplitude and a phase of the sensed signal when the sensing electrodes do not sense either of proximity of the object and contact with the object.

In other features, the method further includes coupling a first input terminal of a differential amplifier to an output of the capacitive sensor and a second input terminal of the differential amplifier to the output of the R-2R ladder circuit. The waveform is a sinewave. The method further includes configuring the R-2R ladder circuit to operate in a voltage mode. The R-2R ladder circuit includes a plurality of rungs each including at least one resistor and a switch configured to selectively connect the at least one resistor to the waveform and the method further includes operating the switches of the plurality of rungs to adjust the amplitude of the offset signal. The R-2R ladder circuit includes a first limit resistor connected between an input of the R-2R ladder circuit and the output of the R-2R ladder circuit and a second limit resistor connected between a common voltage and the output of the R-2R ladder circuit and the method further includes selecting values of the first limit resistor and the second limit resistor to set an adjustable range of the amplitude of the offset signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A change in a signal supplied to a capacitive sensor (corresponding to a sensed signal) in response to a contact with an object is typically small relative to a supplied signal (i.e., a control or drive signal) and may be difficult to detect. Accordingly, different methods may be implemented to improve detection of the change. For example, a waveform generator that provides the signal to the sensor may also supply a duplicate of the signal or a second waveform generator can be provided to supply the duplicate of the signal. The duplicated signal is subtracted from the supplied signal and the result, which can be amplified to improve detection, corresponds to the sensed signal. In some examples, the waveform generator is a sinewave generator such as a Wein bridge oscillator. In other examples, the waveform generator may be configured to supply a digital sine wave to a digital-to-analog converter (DAC) and the output of the DAC is filtered and/or amplified.

In some examples, an offset control module is configured to generate an offset signal that is a duplicate of the sensed signal when there is no contact between an object and the capacitive sensor. The offset control module accordingly to the present disclosure is configured to control an attenuation (i.e., an amplitude) of the offset signal, control an adjustable range of the attenuation, and control a phase of the signal. Further, the offset control module is configured to control the amplitude and phase of the offset signal when the supplied signal (and, therefore, the offset signal) is a sinewave.

Figure 1:
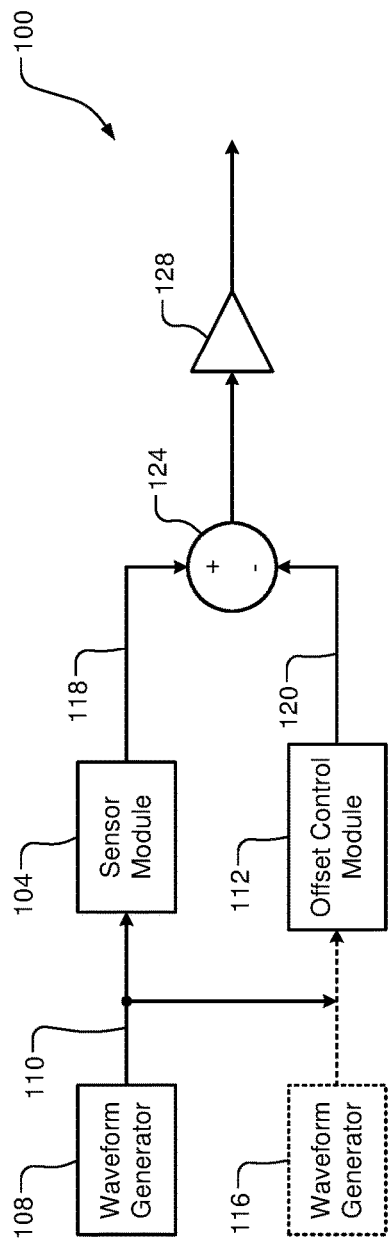
FIG. 1 is an example electronic device including a capacitive sensor.

Referring now to FIG. 1, an example electronic device 100 including a sensor module 104 corresponding to a capacitive sensor is shown. A waveform generator 108 supplies a control or drive signal (e.g., a sinewave) 110 to the sensor module 104. The waveform generator 108 may supply the control signal to an offset control module 112 or an optional second waveform generator 116 may provide a duplicate of the control signal to the offset control module 112.

The sensor module 104 modifies the control signal 110 and generates a sensed signal 118 based on the control signal 110 and proximity or contact with a sensed object. The sensed signal 118 is indicative of whether an object (e.g., a finger) is in contact with the sensor module 104. In some example, the sensed signal 118 indicates a proximity of the object to the sensor module 104. The sensed signal 118 may differ (e.g., in amplitude and/or phase) from the control signal 110 regardless of whether an object is in contact with the sensor module 104.

The offset control module 112 is configured to generate an offset signal 120 that is a duplicate of the sensed signal 118 without contact between an object and the sensor module 104. In other words, the offset control module 112 is configured to modify the control signal 110 in the same manner as the sensor module 104 when there is no contact between an object and the sensor module 104 (and/or, in some examples, when the object is not sufficiently near the sensor module 104 to affect the sensed signal 118). As such, when there is no contact with an object, the sensed signal 118 and the offset signal 120 will be essentially the same (e.g., in magnitude, phase, and/or both magnitude and phase) and a difference between the sensed signal 118 and the offset signal 120 will approach zero.

Conversely, when there is contact between an object and the sensor module 104, the offset signal 120 and the sensed signal 118 will be different. A subtractor 124 outputs a difference between the offset signal 120 and the sensed signal 118, which is amplified by an amplifier 128. The output of the amplifier 128 may then be processed to detect contact with the sensor module 104. For example, contact may be determined based on whether an amplitude and/or a phase of the output of the amplifier 128 exceeds a respective threshold. In some examples, the sensed signal 118 may be indicative of a proximity of the object to the sensor module 104 regardless of whether the object is in direct contact with the sensor module 104. In these examples, the sensed signal 118 may be further indicative of a distance between the object and the sensor module 104.

Figure 2A:
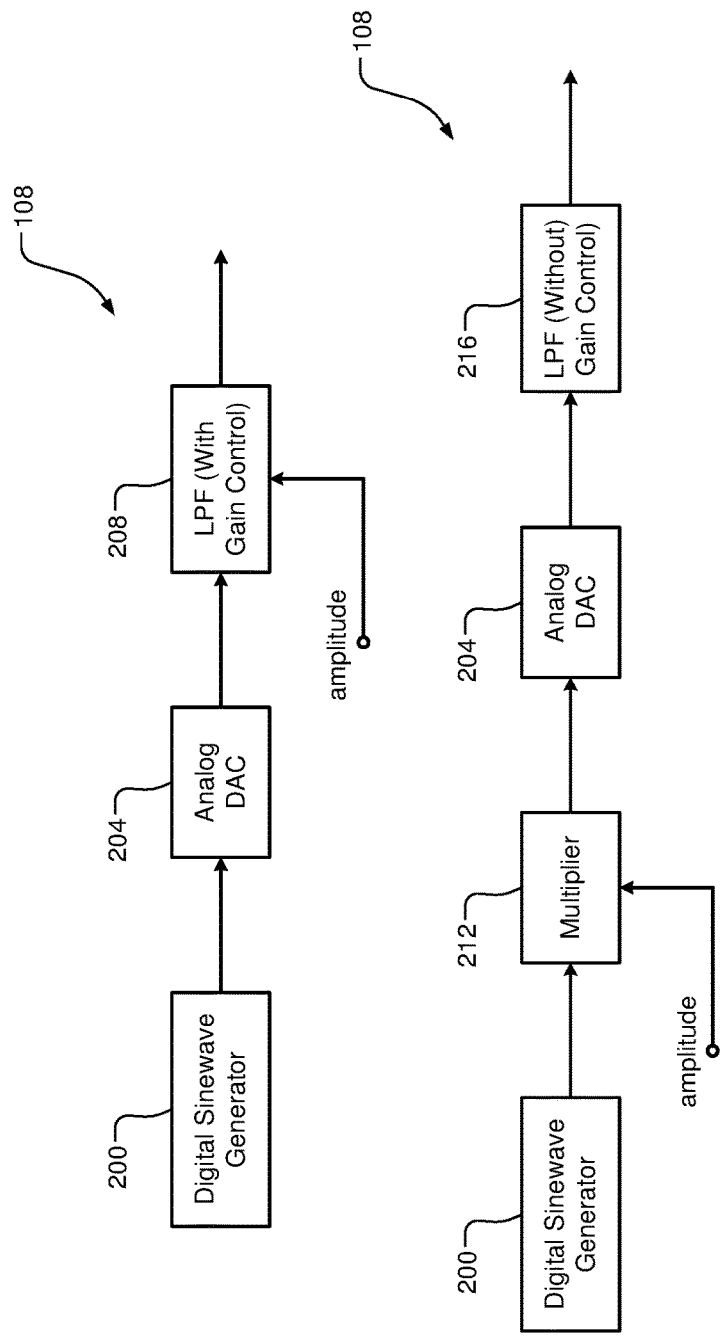
FIGS. 2A and 2B are example waveform generators for a capacitive sensor.
Figure 2B:

In some examples, the waveform generator 108 implements a Wein bridge oscillator, which may be difficult to tune and/or to modulate amplitude. In other examples, the waveform generator 108 may generate a digital sinewave that is subsequently converted to an analog sinewave. For example, as shown in FIGS. 2A and 2B, the waveform generator 108 may include a digital sinewave generator 200. In FIG. 2A, an analog DAC 204 converts the digital sinewave to an analog signal, which is then filtered and amplified (or, in some examples, attenuated) using a Low Pass Filter (LPF) 208 having gain control capabilities. For example, an amplitude control signal is provided to the LPF 208 to control the gain. The LPF 208 may be a first order filter to reduce cost or, in some examples, may be a second, third, or higher order filter. In other examples, a band pass filter may be used.

Conversely, in FIG. 2B, a multiplier 212 is provided between the digital sinewave generator 200 and the analog DAC 204. The amplitude control signal is provided to the multiplier 212 to control the gain. The output of the multiplier (corresponding to the amplified digital sinewave) is provided to the analog DAC 204. The analog signal output by the analog DAC 204 is filtered using an LPF 216 without gain control.

Referring again to FIG. 1, the offset control module 112 according to the principles of the present disclosure is configured to control the amplitude and phase of the offset signal 120 when the control signal 110 is a sinewave. While a conventional R-2R ladder circuit or network operating in a current mode may be used to control an amplitude of a sine wave, a separate circuit (e.g., an all-pass filter) is required to control phase. The offset control module 112 implements an R-2R resistor ladder network configured to operate in a voltage mode to control both the amplitude and the phase of the offset signal 120 without additional circuitry and power consumption.

Figure 3:
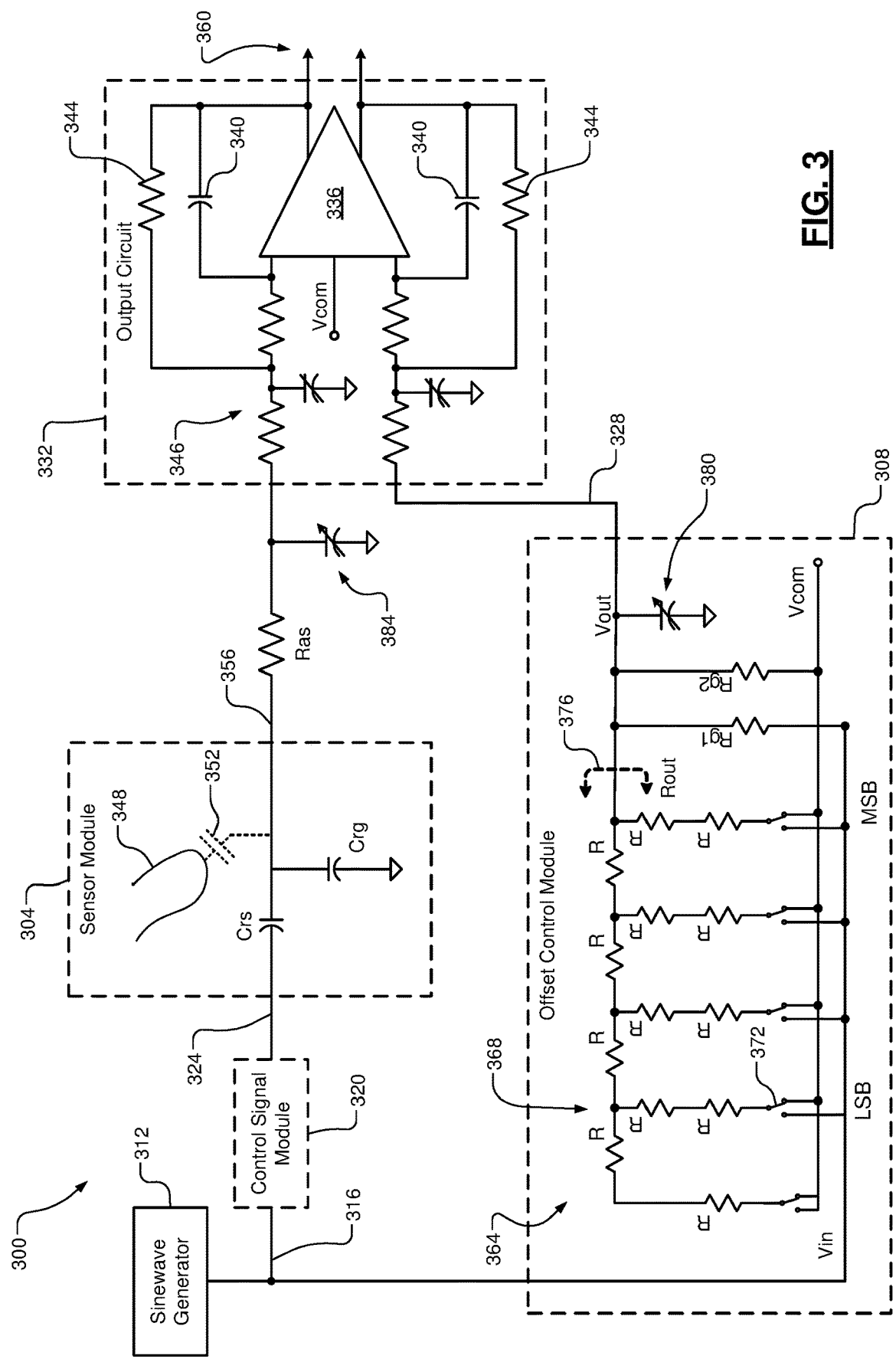
FIG. 3 is an example electronic device implementing an offset control module for a capacitive sensor according to the present disclosure.

Referring now to FIG. 3, an example electronic device 300 including a sensor module 304 (e.g., a capacitive sensor) and implementing an offset control module 308 according to the present disclosure is shown. A waveform generator such as a sinewave generator 312 outputs a waveform (e.g., an analog sinewave, a digital waveform such as a digital sinewave that is converted to an analog sinewave, etc.). In one example, the sinewave generator 312 may include a sinewave lookup table configured to output an M-bit binary representation (i.e., a digital sinewave) of sinewave voltage levels and the waveform 316 may be a result of a conversion of the digital sinewave to an analog sinewave.

The waveform 316 (i.e., the sinewave) is supplied to the sensor module 304 and the offset control module 308. In some examples, the sinewave is also supplied to an optional control signal module 320 and the control signal module 320 provides a control signal 324 to the sensor module 304 based on the sinewave. The control signal module 320 and the offset control module 308 are configured to generate first and second outputs (e.g., modulated sinewaves corresponding to the control signal 324 and an offset signal 328, respectively) based on the waveform 316. The control signal 324 is provided to the sensor module 304 and the offset signal 328 is provided as an input to an example output circuit 332 including an amplifier 336 (e.g., in some examples, a differential amplifier), feedback capacitors 340, and feedback resistors 344. The output circuit 332 is shown for example only and other configurations of the output circuit 332 may be used. The output circuit 332 may include filter circuitry 346 (e.g., one or more resistors and/or adjustable capacitors) configured to filter signals input to the amplifier 336. In the example of FIG. 3, the output circuit 332 is configured as a multiple feedback filter. In this case, the circuit of the multiple feedback filter performs the gain and additional filtering to reduce noise. In addition, the amplifier 336 may be a fully differential amplifier. That is, the output circuit 332 is a fully differential version of a typical 2nd order multiple feedback filter.

For example, the amplifier 336 has a first input terminal (e.g., an inversion input terminal) connected to the output of the sensor module 304 (e.g., the sensor module 304 has one or more sensing electrodes connecting to the first input terminal of the amplifier 336). A second input terminal (e.g., a non-inversion input terminal) of the amplifier 336 is connected to the offset signal 328 and a third input terminal of the amplifier 336 is connected to a common voltage (Vcom).

The sensor module 304 corresponds to a capacitive sensor (e.g., a capacitive touch circuit) including parasitic capacitances Crs and Crg that modify an amplitude and phase of the control signal 324. The control signal 324 is connected to the one or more sensing electrodes through the capacitance Crs. When an object (e.g., finger 348) approaches (i.e., becomes within a proximity of) and/or contacts the one or more sensing electrodes of the sensor module 304, a capacitance 352 of the finger 348 further modifies the amplitude and phase of the control signal 324. Accordingly, the sensor module 304 generates, as an output, a sensed signal 356 indicative of whether an object such as the finger 348 is in contact with the sensor module 304 or, in some examples, a proximity of the finger 348 to the sensor module 304.

The output circuit 332 (e.g., the amplifier 336) detects and outputs a difference between the sensed signal 356 and the offset signal 328. For example, the control signal module 320 and the offset control module 308 are configured such that the sensed signal 356 and the offset signal 328 (i.e., respective amplitudes and phases of the sensed signal 356 and the offset signal 328) are the same when there is no contact between the sensor module 304 (e.g., the one or more sensing electrodes) and an object such as the finger 348. In some examples, the control signal module 320 is configured to adjust a phase and an amplitude of the control signal 324 to correspondingly adjust the phase and amplitude of the sensed signal 356.

Conversely, the offset control module 308 is configured to adjust a phase and an amplitude of the offset signal 328 such that the output of the output circuit 332 (e.g., an output signal 360 of the amplifier 336) becomes substantially zero when there is no contact between the sensor module 304 (the one or more sensing electrodes) and the object. In other words, the offset control module 308 is configured to adjust the phase and the amplitude of the offset signal 328 such that the phase and the amplitude of the offset signal 328 respectively coincide with a phase and an amplitude of the sensed signal 356 when the sensing electrodes of the sensor module 304 do not sense the proximity of or contact with an object. For example, the parasitic capacitances Crs and Crg modify the amplitude and phase of the control signal 324. The offset control module 308 adjusts the amplitude and the phase of the offset signal 328 to compensate for the changes to the control signal 324 caused by the parasitic capacitances Crs and Crg. The output of the output circuit 332 (i.e., the output signal 360) indicates whether there is contact between the sensor module 304 and the finger 348 or, in some examples, a proximity of the finger 348 to the sensor module 304 based on a comparison between the sensed signal 356 and the offset signal 328.

The offset control module 308 according to the present disclosure includes an R-2R resistor ladder 364 (an R-2R ladder circuit) coupled to an output of the sinewave generator 312 and configured to operate in a voltage mode. In other words, the resistor ladder 364 is configured to output the offset signal 328 at a desired voltage (Vout). Using the resistor ladder 364, the offset control module 308 is configured to generate the offset signal 328 based on the waveform 316 and a configuration of the offset control module 308 (e.g., a configuration of the resistor ladder 364) that is adjustable to selectively adjust a phase and an amplitude of the offset signal 324.

The resistor ladder 364 includes a plurality of resistors R each having a same resistance value. For example, the resistor ladder 364 includes a plurality of rungs 368 includes one or two of the resistors R connected in series with a respective switch 372. The switches 372 switch between the waveform 316 (corresponding to an input voltage Vin) and the common voltage Vcom in response to a binary control signal input to the switches 372. The switches 372 are controlled to connect and disconnect selected rungs 368 of the resistors R to achieve a desired attenuation of the offset signal 328. In other words, the resistor ladder 364 is configured as a programmable attenuator that adjusts the amplitude of the offset signal 328 in response to the binary control signal used to control the switches 372.

First and second limit resistors Rg1 and Rg2 connected in parallel with the rungs 368 are selected to set upper and lower limits for the programmable attenuator. The resistor Rg1 is connected between the output of the resistor ladder 364 and the input voltage Vin. The resistor Rg2 is connected between the output of the resistor ladder 364 and the common voltage Vcom. For example, the output voltage of the offset control module 308 (i.e., of the offset signal 328) corresponds to:

$$Vout=m(Vin)*((Rg1\|Rg2)/(R+Rg1\|Rg2)+(R\|Rg2)/(Rg1+R\|Rg2)),$$

where m is a ratio set by the binary control signal and Vin is the input voltage.

Accordingly, the values of the resistors Rg1 and Rg2 determine upper and lower limits of an adjustable range of the amplitude of the offset signal 328.

An output resistance or impedance Rout (as measured at 376 of the resistor ladder 364) is constant regardless of whether the switches 372 are ON (i.e., connected to the input voltage Vin) or OFF (i.e., connected to the common voltage Vcom). A resistor Ras having the same resistance as Rout is connected to an output of the sensor module 304. The values of the resistors Rg1 and Rg2 may be determined in accordance with a desired value of the output resistance Rout, a desired minimum ratio (min) of the resistor ladder 364, and a desired maximum ratio (max) of the resistor ladder 364

(where min and max correspond to lower and upper limits of the adjustable range of the amplitude of the offset signal 328).

For example, an overall value Rdac of the resistor ladder 364 corresponds to Rdac=(Rout/span), where span=(max−min). Rg1 is calculated in accordance with Rg1=Rth/Vth, where Rth=span*(Rdac/(1−span)) and Vth=min*(Rdac+Rth)/Rdac. Rg2 is calculated in accordance with Rg2=Vth*Rg1/(1−Vth).

To adjust the phase of the offset signal 328, the offset control module 308 adjusts an adjustable or variable capacitor 380 connected between an output of the resistor ladder 364 and a reference voltage (e.g., ground). For example, adjusting a capacitance value of the adjustable capacitor 380 adjusts an RC time constant of the resistor ladder 364 to adjust the phase of the offset signal 328 without significantly changing the amplitude of the offset signal 328. Accordingly, when a desired amplitude of the offset signal 328 is achieved by adjusting the resistor ladder 364 (i.e., by operating the switches of the plurality of rungs 368), the adjustable capacitor 380 can further be adjusted to adjust the phase of the offset signal 328 (e.g., by 1-10 degrees) without causing large changes to the amplitude of the offset signal 328. In other words, adjusting the capacitance of the adjustable capacitor 380 causes larger changes in the phase of the offset signal 328 relative to the amplitude of the offset signal 328. Conversely, since the output resistance Rout of the resistor ladder 364 is constant, the amplitude of the offset signal 328 can be adjusted without changing the phase of the offset signal 328.

In this manner, the offset control module 308 is configured to adjust the attenuation (i.e., the amplitude) of the offset signal 328 by controlling the switches 372 of the resistor ladder 364, control an adjustable range of the attenuation using selected values of the resistors Rg1 and Rg2, and control a phase of the offset signal 328 using the adjustable capacitor 380. More specifically, the offset control module 308 is configured to control the amplitude of the offset signal 328 when the input signal (and, therefore, the offset signal 328) is a sinewave and to further fine-tune the phase of the offset signal 328 without significantly modifying the desired amplitude of the offset signal 328. For example, the resistor ladder 364 and the adjustable capacitor 380 are adjusted without the finger 348 in contact with the sensor module 304 until the output 360 is approximately 0V (e.g., within 100 mV of 0V). In some examples, a second adjustable capacitor 384 is connected to the output of the sensor module 304. For example, the adjustable capacitor 380 is used to control positive phase adjustment while the adjustable capacitor 384 is used to control negative phase adjustment (e.g., by adjusting the phase of the sensed signal 356).

Furthermore, in order to reduce sensitivity to external noise, the resistor Ras and the second adjustable capacitor 384 form a filter. In other words, a low pass filter including the resistor Ras and the second adjustable capacitor 384 is located on a pre-stage of the output circuit 332. As the filter of the resistor Ras and the second adjustable capacitor 384 can reduce high frequency noise before amplification, the sensed signal 356 can use the full range of the power supply. The resistor ladder 364 and the adjustable capacitor 380 perform as a similar filter which further reduces common-mode noise. The 1st order filter of the resistor Ras and the second adjustable capacitor 384 and the output circuit 332 as a 2nd order multiple feedback filter together form a 3rd order filter, which effectively reduces the external noise.

Figure 4:
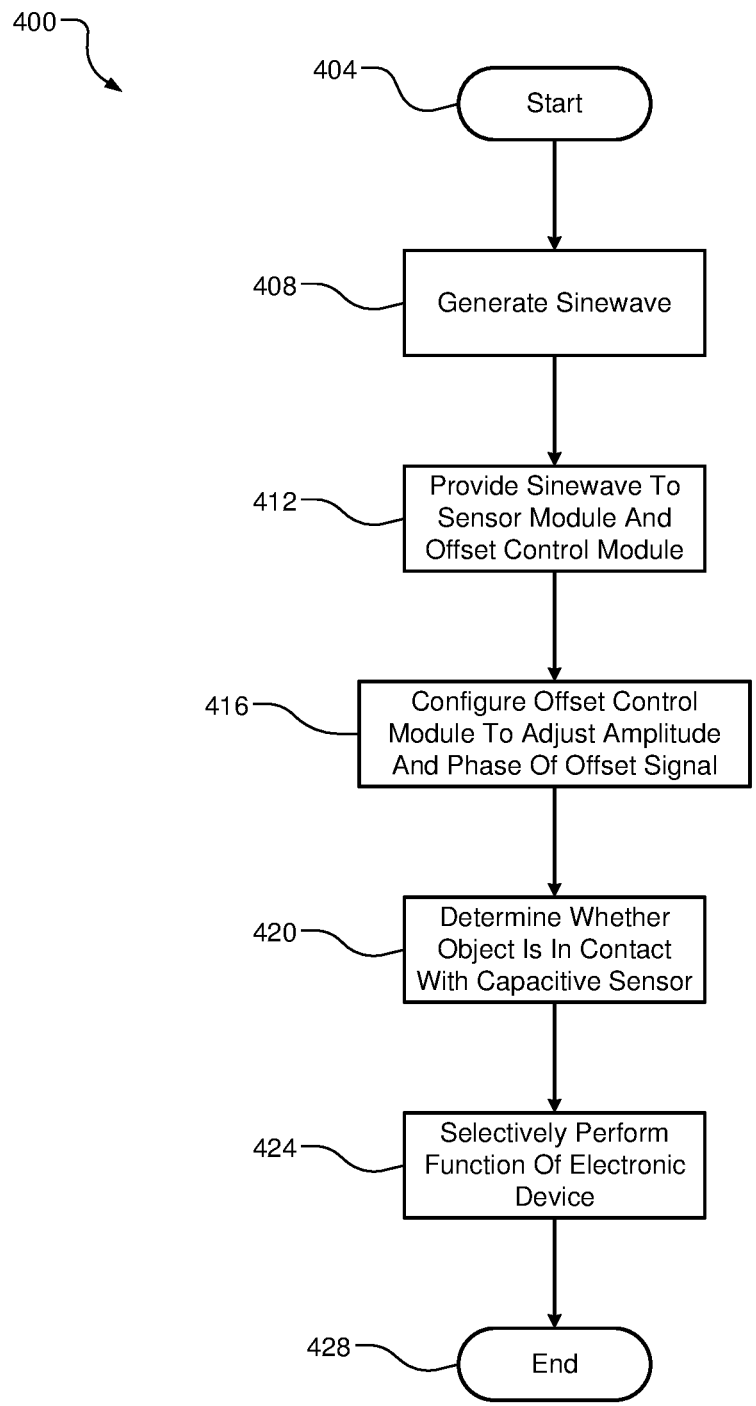
FIG. 4 is an example method for generating an offset signal for a capacitive sensor according to the present disclosure.

Referring now to FIG. 4, an example method 400 for generating an offset signal for a capacitive sensor according to the present disclosure begins at 404. At 408, the method 400 (e.g., using the sinewave generator 312) generates a sinewave corresponding to a control or drive signal for a capacitive sensor. At 412, the method 400 provides the sinewave to a sensor module and an offset control module (e.g., the sensor module 304 and the offset control module 308 as shown in FIG. 3). In some examples (as shown in FIG. 3), the sinewave is provided to a control signal module (e.g., the control signal module 320) configured to generate the control signal 324 based on the sinewave and to provide the control signal 324 to the sensor module 304.

At 416, the offset control module 308 is configured to adjust the amplitude and phase of the offset signal. For example, the offset control module 308 is configured to compensate for changes to the amplitude and the phase of the control signal 324 caused by parasitic capacitances associated with the sensor module 304. For example, the resistor ladder 364 and the adjustable capacitor 380 (and, in some examples, the adjustable capacitor 384) are adjusted without the finger 348 in contact with the sensor module 304 until the output 360 is approximately 0V (e.g., within 100 mV of 0V).

At 420, during operation of an electronic device including the sensor module 304, the method 400 determines whether an object (e.g., the finger 348) is in contact with a sensing surface of a capacitive sensor. For example, the method 400 compares the sensed signal 356 to the offset signal 328 using the output circuit 332. At 424, the method 400 selectively performs a function of the electronic device based on a result of the comparison. The method 400 ends at 428.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for generating an offset signal for a capacitive sensor, the system comprising:
    a waveform generator configured to generate a waveform;
    an R-2R ladder circuit having a constant output resistance, wherein the R-2R ladder circuit is coupled to an output of the waveform generator and configured to generate the offset signal based on the waveform; and
    an adjustable capacitor that is connected between an output of the R-2R ladder circuit and a reference voltage,
    wherein the capacitive sensor includes one or more sensing electrodes coupled to the waveform generator through a capacitance and is configured to generate a sensed signal by sensing either of proximity of an object and contact with the object, and
    wherein the R-2R ladder circuit and the adjustable capacitor are configured to adjust amplitude and phase of the offset signal such that the amplitude and the phase of the offset signal respectively coincide with an amplitude and a phase of the sensed signal when the sensing electrodes do not sense either of proximity of the object and contact with the object.

2. The system of claim 1, further comprising an output circuit including a differential amplifier having a first input terminal coupled to an output of the capacitive sensor and a second input terminal coupled to the output of the R-2R ladder circuit.

3. The system of claim 2, wherein the output circuit is configured as a multiple feedback filter, and wherein the differential amplifier is a fully differential amplifier.

4. The system of claim 2, further comprising a low pass filter including a resistor and a second adjustable capacitor, the low pass filter being located on a pre-stage of the output circuit, wherein adjusting the second adjustable capacitor adjusts the phase of the sensed signal.

5. The system of claim 1, wherein the waveform is a sinewave.

6. The system of claim 1, further comprising a control signal module configured to generate a control signal based on the waveform.

7. The system of claim 1, wherein the R-2R ladder circuit is configured to operate in a voltage mode.

8. The system of claim 7, wherein the R-2R ladder circuit includes a plurality of rungs each including at least one resistor and a switch configured to selectively connect the at least one resistor to the waveform.

9. The system of claim 8, wherein operating the switches of the plurality of rungs adjusts the amplitude of the offset signal.

10. The system of claim 9, wherein the R-2R ladder circuit includes a first limit resistor connected between an input of the R-2R ladder circuit and the output of the R-2R ladder circuit, and a second limit resistor connected between a common voltage and the output of the R-2R ladder circuit, wherein values of the first limit resistor and the second limit resistor are selected to set an adjustable range of the amplitude of the offset signal.

11. A method for generating an offset signal for a capacitive sensor, the method comprising:
   generating a waveform;
   receiving the waveform at an R-2R ladder circuit having a constant output resistance, and, using the R-2R ladder circuit, generating the offset signal based on the waveform;
   connecting an adjustable capacitor between an output of the R-2R ladder circuit and a reference voltage;
   receiving the waveform at one or more sensing electrodes of the capacitive sensor;
   sensing, using one or more sensing electrodes, either of proximity of and contact with an object to generate a sensed signal; and
   using the R-2R ladder circuit and the adjustable capacitor, adjusting amplitude and phase of the offset signal such that the amplitude and the phase of the offset signal respectively coincide with an amplitude and a phase of the sensed signal when the sensing electrodes do not sense either of proximity of the object and contact with the object.

12. The method of claim 11, further comprising coupling a first input terminal of a differential amplifier to an output of the capacitive sensor and a second input terminal of the differential amplifier to the output of the R-2R ladder circuit.

13. The method of claim 11, further comprising configuring the R-2R ladder circuit to operate in a voltage mode.

14. The method of claim 11, wherein the R-2R ladder circuit includes a plurality of rungs each including at least one resistor and a switch configured to selectively connect the at least one resistor to the waveform, the method further comprising operating the switches of the plurality of rungs to adjust the amplitude of the offset signal.

15. The method of claim 14, wherein the R-2R ladder circuit includes a first limit resistor connected between an input of the R-2R ladder circuit and the output of the R-2R ladder circuit, and a second limit resistor connected between a common voltage and the output of the R-2R ladder circuit, the method further comprising selecting values of the first limit resistor and the second limit resistor to set an adjustable range of the amplitude of the offset signal.

* * * * *